(12) United States Patent (10) Patent No.: US 8,325,772 B2
Nishimura et al. (45) Date of Patent: Dec. 4, 2012

(54) OPTICAL DISK APPARATUS AND INFORMATION RECORDING METHOD

(75) Inventors: Koichiro Nishimura, Yokohama (JP); Masayuki Inoue, Yokohama (JP); Toshifumi Takeuchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 12/839,639

(22) Filed: Jul. 20, 2010

(65) Prior Publication Data

US 2011/0103206 A1 May 5, 2011

Related U.S. Application Data

(63) Continuation of application No. 11/580,974, filed on Oct. 13, 2006, now Pat. No. 7,778,294.

(30) Foreign Application Priority Data

Jun. 14, 2006 (JP) ................................. 2006-164170

(51) Int. Cl.
*H01S 3/04* (2006.01)
*H01S 3/00* (2006.01)
(52) U.S. Cl. ........................ 372/34; 372/38.02
(58) Field of Classification Search .................. 372/34, 372/38.02
See application file for complete search history.

(56) References Cited

U.S. PATENT DOCUMENTS

| 4,856,011 | A | | 8/1989 | Shimada et al. | |
|---|---|---|---|---|---|
| 5,274,622 | A | * | 12/1993 | Kono | ............... 369/116 |
| 2001/0055260 | A1 | | 12/2001 | Numata | |
| 2002/0114365 | A1 | * | 8/2002 | Gilliland et al. | ............ 372/38.02 |
| 2003/0099178 | A1 | | 5/2003 | Sho | |
| 2004/0052186 | A1 | | 3/2004 | Yano et al. | |
| 2004/0264527 | A1 | * | 12/2004 | Ochiai et al. | .................. 372/38.1 |

FOREIGN PATENT DOCUMENTS

| JP | 04-263130 A | 9/1992 |
|---|---|---|
| JP | 05-144061 A | 6/1993 |
| JP | 05-218546 A | 8/1993 |
| JP | 06-089453 A | 3/1994 |
| JP | 09-326522 A | 12/1997 |
| JP | 2002-158395 A | 5/2002 |
| JP | 2002-260266 A | 9/2002 |
| JP | 2004-005927 A | 1/2004 |

OTHER PUBLICATIONS

USPTO Office Action dated Sep. 29, 2008 for U.S. Appl. No. 11/580,974.
USPTO Final Office Action dated Apr. 29, 2009 for U.S. Appl. No. 11/580,974.
USPTO Office Action dated Sep. 29, 2009 for U.S. Appl. No. 11/580,974.
USPTO Notice of Allowance dated Apr. 15, 2010 for U.S. Appl. No. 11/580,974.

* cited by examiner

*Primary Examiner* — Patrick Stafford
(74) *Attorney, Agent, or Firm* — Kilpatrick Townsend & Stockton LLP

(57) ABSTRACT

In an optical disk apparatus, by obtaining the temperature in the vicinity of a laser in the apparatus, the power source voltage of the laser driver is controlled such that power consumed by the headroom of the laser driver is reduced to the maximum extent without deteriorating the current drive characteristic of the headroom when the temperature becomes higher. The laser driving current of the laser driver is monitored to control the power source of the laser driver such that the power consumed by the headroom is possibly reduced while maintaining the current drive characteristic of the headroom for the monitored current.

7 Claims, 10 Drawing Sheets

OPTICAL DISK APPARATUS AND INFORMATION RECORDING METHOD

CLAIM OF PRIORITY

This application is a continuation application of U.S. patent application Ser. No. 11/580,974, filed on Oct. 13, 2006, which claims priority from Japanese application serial no. JP 2006-164170, filed on Jun. 14, 2006, the contents of both of which are incorporated by reference into this application, in their entireties for all purposes.

BACKGROUND OF THE INVENTION

The present invention relates to an optical disk apparatus and an information recording method for the same including a laser driver mounted thereon, the laser driver supplying power to a laser to record information on an optical disk.

In the recording of data on an optical disk by emitting a laser beam thereonto, the waveform of each laser pulse of the laser beam is appropriately controlled according to the length of a mark or a space recorded on the disk to thereby record the data with high precision. The laser pulse is controlled by adjusting a current (to be referred to as "laser driving current" hereinbelow) supplied from a laser driver to the laser.

The laser driver includes a pulse controller to set a laser pulse using a pulse signal according to record data, a power setting section to set laser power, and a laser driver to drive a laser according to the pulse setting and the power setting.

The more the recording speed of the optical disk is, the more the laser power required to record data on the optical disk is. It is possible to increase the laser power by supplying a larger current from the laser driver to the laser. The more the current from the laser driver to the laser is, the more the power consumed by the laser driver (particularly by the laser driving section) is. This increases a calorific value or calorific power of the laser driver. When the temperature of the laser driver becomes higher, the temperature also becomes higher in a pickup on which the laser driver is mounted as well as in the laser mounted on the pickup.

It has been known that the power consumed by the laser driver is a product between a laser driving current supplied from the laser driver to the laser and a voltage (to be referred to as "headroom voltage" hereinbelow) obtained by subtracting "laser driving voltage" supplied to the laser from "power source voltage" supplied to the laser driver (particularly the laser driving section).

Also, there has been known a phenomenon in which when the laser driver temperature rises, the laser driving voltage supplied from the laser driver lowers. This phenomenon leads to a problem. That is, when the laser driver temperature rises, the laser driving voltage lowers and the headroom voltage becomes higher. This increases power consumption of the laser driver, and the calorific value of the laser driver becomes greater. Resultantly, the laser driver temperature further rises. This leads to a vicious cycle of the rising of the laser driver temperature.

To solve this problem, JP-A-2002-158395 and JP-A-2002-260266 propose a method in which by controlling the power source voltage such that the headroom voltage is kept fixed, the power consumed by the laser driver is kept fixed.

SUMMARY OF THE INVENTION

In general, the laser driving section of the laser driver includes bipolar transistors or metal-oxide semiconductor (MOS) transistors to amplify the laser driving current. FIG. 18 shows an example of a laser driver including bipolar transistors (to be simply referred to as transistors hereinbelow).

In FIG. 18, VSO indicates a power source of the laser driving section, 303 and 1701 are transistors, and 103 is a laser. An output current of the transistor 303 is controlled by a control signal 204 (Ib) from the pulse generator. The output current is amplified by the transistor 1701. A collector current Ic outputted from the transistor 1701 is supplied as a laser driving current from a laser driving output terminal 206 to the laser 103. In the configuration, the voltage between the power source VSO and ground corresponds to "power source voltage" described above. The voltage Vce between a collector and an emitter of the transistor 1701 corresponds to the "headroom voltage". The voltage drop in the laser 103 corresponds to the "laser driving voltage".

Next, referring to FIG. 7, description will be given of a relationship between the collector-emitter voltage Vce and the maximum value of the collector current Ic of the transistor. As shown in FIG. 7, according to the base current Ib, the maximum value of the collector current Ic depends on the collector-emitter voltage Vce. That is, when it is desired to change the maximum value of the collector current Ic from I1 to I2, it is required to change the collector-emitter voltage Vce from V1 to V2 by $\Delta V2$.

Therefore, it is not possible for the control method proposed by JP-A-2002-158395 and JP-A-2002-260266, which keeps the headroom voltage Vce fixed, to appropriately control the maximum value of the collector current Ic supplied to the laser. This hence leads to a problem of difficulty in the control of desired laser power, namely, a problem in which when the headroom voltage Vice is fixed to, for example, V1, the laser power cannot be controlled by use of the collector current I2.

It is therefore an object of the present invention to provide an optical disk apparatus and an information recording method for the apparatus to remove the problem.

DESCRIPTION OF THE EMBODIMENTS

Figure 1:
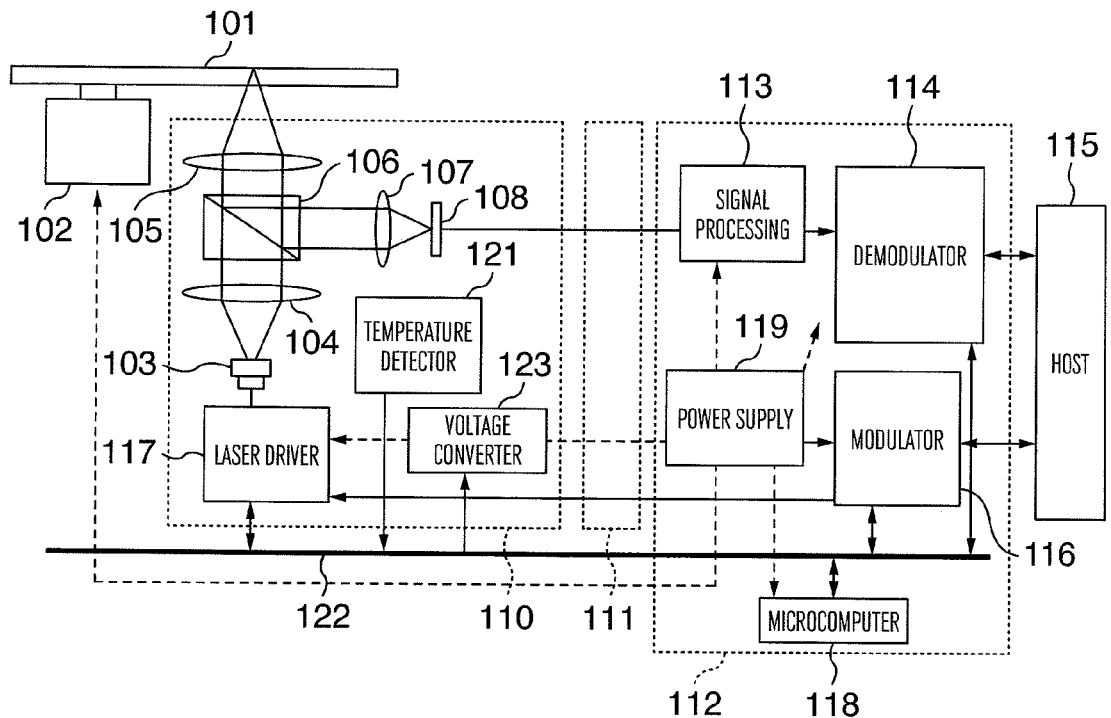
FIG. 1 is a block diagram showing a configuration of an optical disk apparatus in a first embodiment of the present invention.

FIG. 1 shows a configuration of an optical disk apparatus in a first embodiment of the present invention in a block diagram. A pickup 110 disposed to be movable in a radial direction of an optical disk in the optical disk apparatus is connected via a flexible cable 111 to a main board 112 fixed in the optical disk apparatus.

A laser beam emitted from a laser 103 on the pickup 110 is radiated through a collimating lens 104 and an objective or an objective glass 105 onto a predetermined radial position of an optical disk 101 driven by a spindle motor 102 for rotation thereof. Reflected light of the radiated laser beam from the optical disk 101 is collected via a beam splitter 106 and is then condensed by a condenser 107. The condensed light is thereafter converted by an photoelectrical converter 108 into an electric signal (to be simply referred to as a signal). The obtained signal is fed via the flexible cable 111 to a signal processing circuit 113 on the main board 112 to be processed therein. The processed signal is demodulated by a demodulator 114 into data. The data is transferred to a host 115 outside the optical disk apparatus.

In an operation to record data, the data sent from the host 115 is converted by a modulator 116 into a record pulse control waveform to be sent to a laser driver 117 disposed on the pickup 110. The laser driver 117 operates according to the waveform inputted thereto and a record power setting to output therefrom a driving pulse current to the laser 103.

A power supply 119 on the main board 112 supplies a current with a predetermined voltage to the signal processing circuit 113, the demodulator 114, the modulator 116, a microcomputer 118, the laser driver 117 on the pickup 110, a temperature detecting circuit or a temperature detector 121, the spindle motor 102, and the like on the main board 112.

The temperature detector 121 detects temperature in the periphery of the laser 103 or the laser driver 117 on the pickup 110 and sends data of the temperature via a data bus 122 to the microcomputer 118. Under control of the microcomputer 118, a voltage converter 123 including a converting unit 124 provides a voltage depending on the temperature detected by the temperature detector 121 to the laser driver 117.

Figure 2:
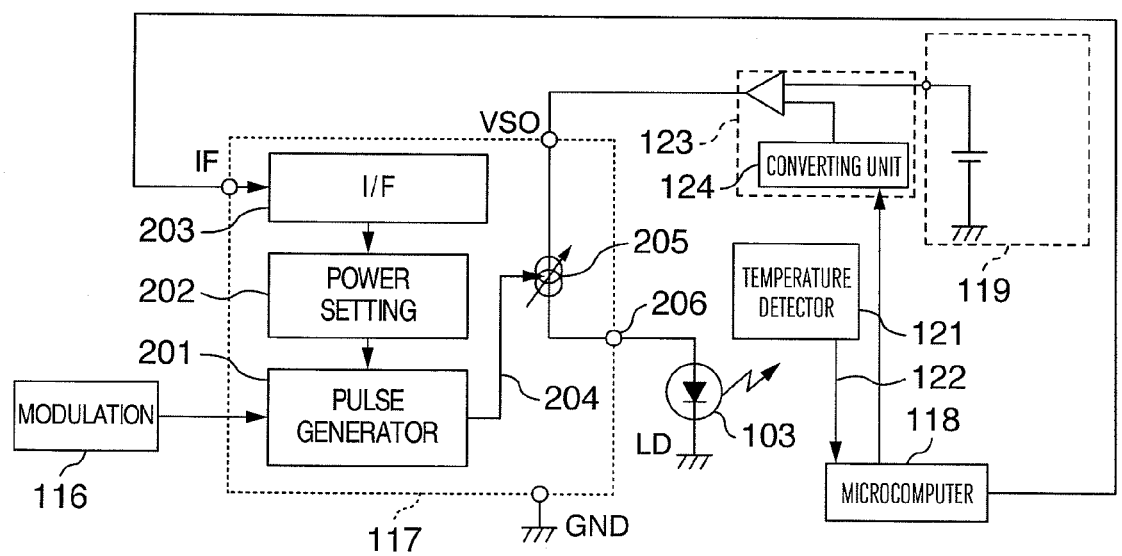
FIG. 2 is a block diagram showing an internal configuration of the laser driver and a peripheral circuit configuration of the first embodiment.

FIG. 2 shows in detail the laser driver 117 and the peripheral circuits thereof described in conjunction with FIG. 1. In the data recording phase, a control timing signal for the laser pulse is inputted from the modulator 116 to a pulse generator 201 in the laser driver 117. A laser power setting instruction corresponding to the control timing signal inputted to the pulse generator 201 is sent from the microcomputer 118 via an interface 203 in the laser driver 117 to a power setting section 202 to resultantly set laser power to the pulse generator 201 corresponding to each pulse timing. A sequence of laser pulses generated by the pulse generator 201 are sent to a variable current source 205 to control, via a power source VSO of the laser driving section, the current supplied from the voltage converter 123.

Figure 3:
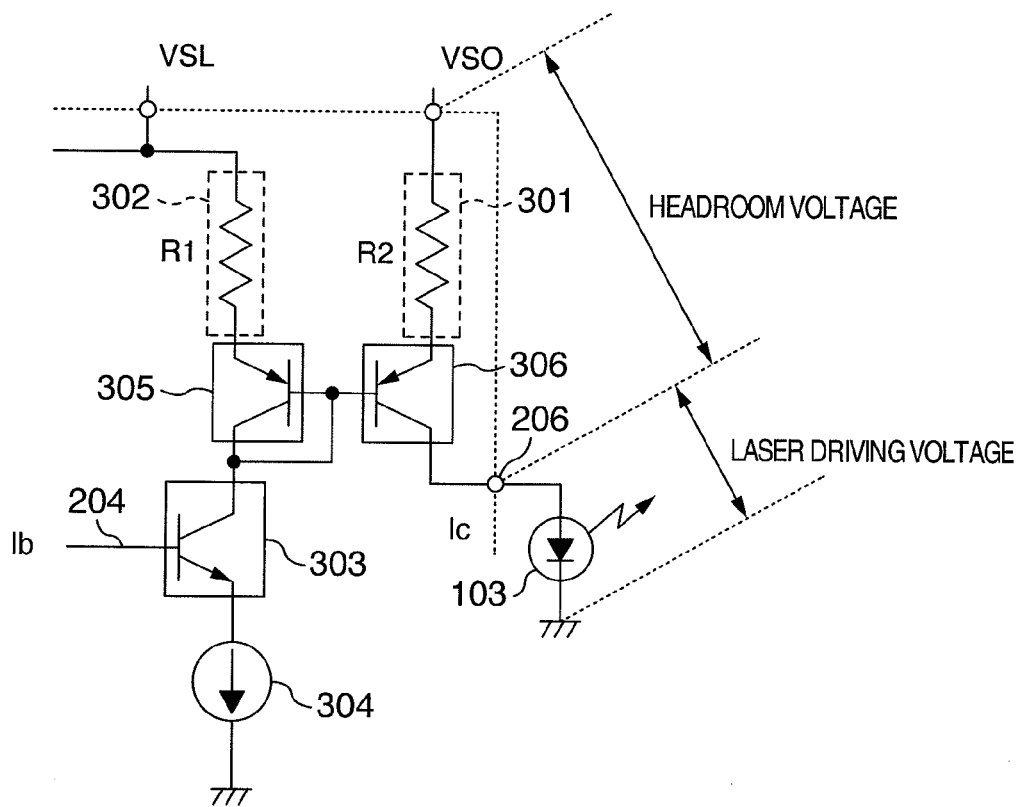
FIG. 3 is a diagram showing a configuration of a variable current source in the first embodiment.

FIG. 3 shows in detail the circuit configuration of the current source 205 of FIG. 2. control signal 204 (Ib) from the pulse generator 201 is sent via a transistor 303 and a bias current generator 304 to a current mirror circuit including resistors 301 (R2) and 302 (R1) and transistors 305 and 306 for amplification of a current thereof. The current Ic thus amplified by the current mirror circuit is fed from the laser drive output terminal 206 to the laser 103. The headroom voltage generated in FIG. 3 is the sum of the voltage drop caused by the resistor 301 (R2) and the collector-emitter voltage Vice appearing in the transistor 306.

Figure 4:
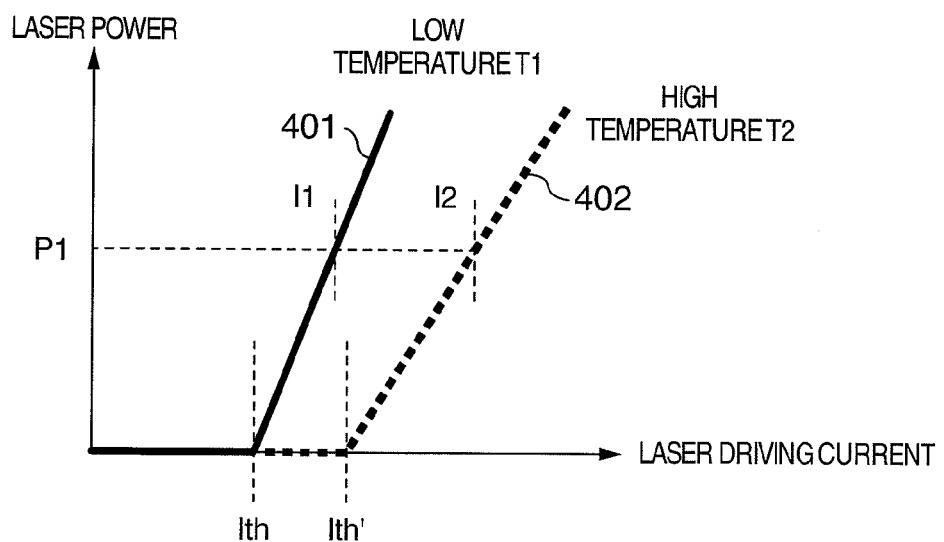
FIG. 4 is a graph schematically showing a relationship between the laser driving current and the laser power.
Figure 5:
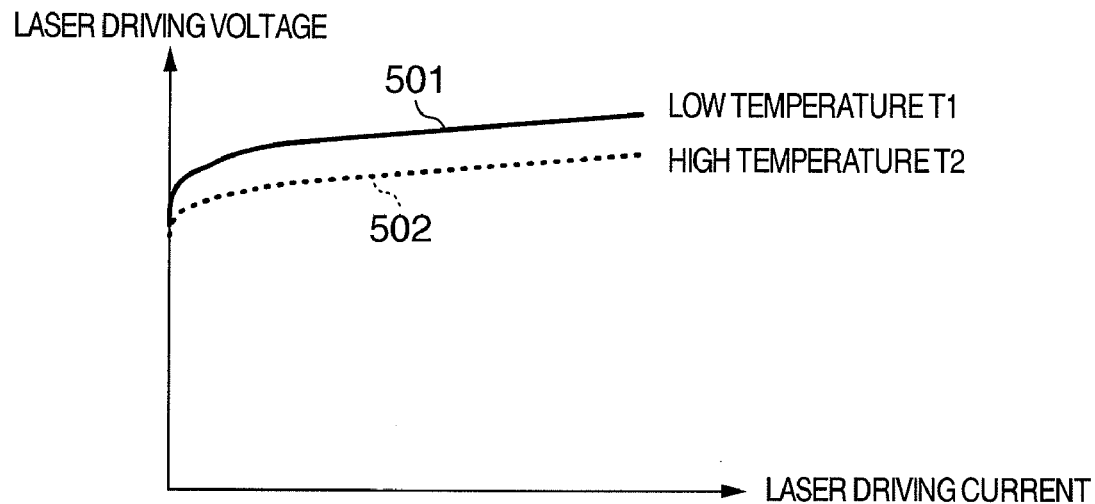
FIG. 5 is a graph schematically showing a relationship between the laser driving current and the laser driving voltage.
Figure 6:
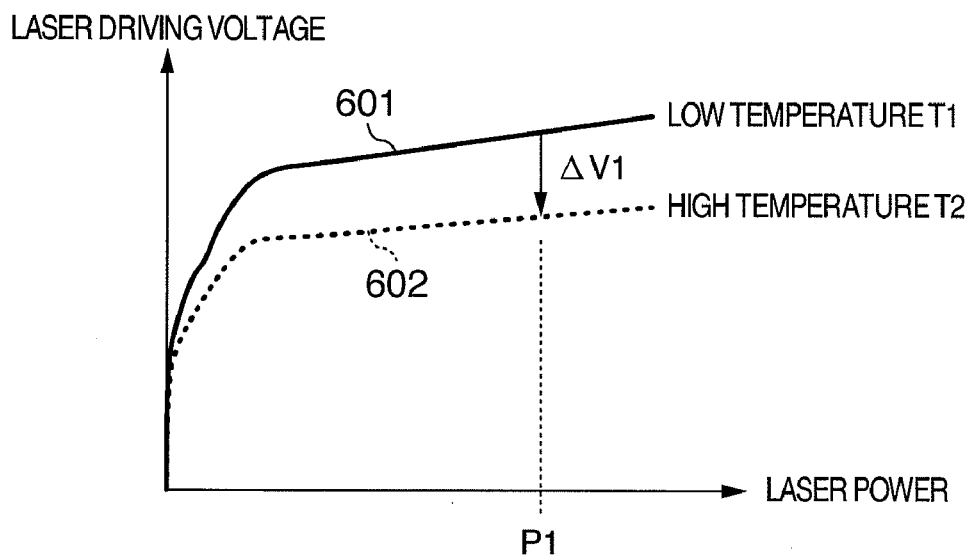
FIG. 6 is a graph schematically showing a 20 relationship between the laser power and the laser driving voltage.

Referring now to FIGS. 4 to 6, description will be given of characteristics of a laser in the embodiment.

FIG. 4 shows a relationship (to be referred to as "LD-IL characteristic" hereinbelow) between the laser driving current and the laser power in a graph. In the graph, a solid line 401 indicates the characteristic at low temperature T1 and a broken line 402 indicates the characteristic at high temperature T2. As can be seen from the solid line 401, the laser driving current is substantially proportional to the laser power when the laser driving current exceeds a predetermined current value Ith at low temperature T1. As indicated by the graph in which the characteristic 401 at low temperature T1 changes to the characteristic 402 at high temperature T2, the LD-IL characteristic lowers as the temperature becomes higher. That is, to secure predetermined laser power, a laser driving current I1 suffices at low temperature T1. However, at high temperature T2, there is required a laser driving current 12 (I2>I1).

FIG. 5 shows in a graph a relationship (to be referred to as "LD-IV characteristic" hereinbelow) between the laser driving current and the laser driving voltage across the laser ends. In FIG. 5, a solid line 501 indicates the LD-IV characteristic at low temperature Ti and a broken line 502 indicates the LD-IV characteristic at high temperature T2. As indicated by the solid line 501, the laser driving voltage becomes higher when the laser driving current increases at low temperature T1. As indicated by the broken line 502, this relationship is also satisfied at high temperature T2. Since the characteristic 501 at low temperature T1 changes to the characteristic 502 at high temperature T2, the LD-IV characteristic lowers as the temperature becomes higher. That is, to secure the same laser driving current, it is required to lower the laser driving voltage when the temperature becomes higher.

FIG. 6 shows a relationship between the laser power and the laser driving voltage derived from FIGS. 4 and 5. In FIG. 6, a solid line 601 indicates the relationship at low temperature T1 and a broken line 602 indicates the relationship at high temperature T2. As can be seen from FIG. 6, to secure predetermined laser power, e.g., P1, if the temperature rises from low temperature T1 to high temperature T2, it is required to lower the laser driving voltage by ΔV1. There exists can be recognized a tendency in which the higher the laser power is, the more the value of ΔV1 is.

Figure 7:
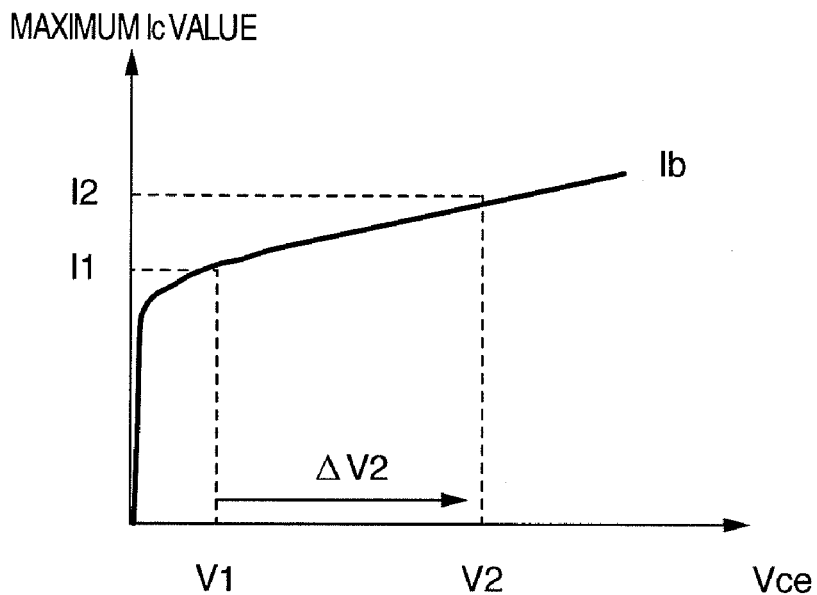
FIG. 7 is a graph showing an example of the Vce-Ic characteristic of a transistor.
Figure 19:
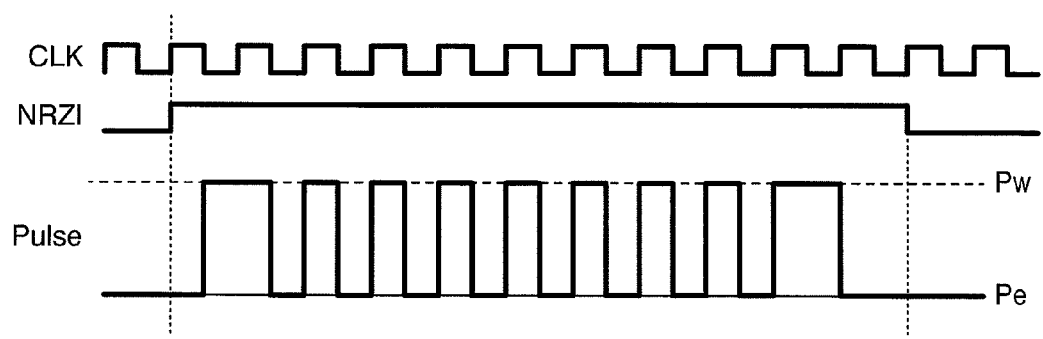
FIG. 19 is a graph showing an example of a laser pulse.

Referring now to FIG. 7, description will be given of a relationship between the emitter-collector voltage Vice and the collector current Ic of the transistor 306. The base current Ib of FIG. 7 depends on the pulse driving current inputted as the control signal 204 in FIG. 2. When the multipulse driving waveform is produced, for example, as shown in FIG. 19, the current value of the control signal 204 also varies in a pulsating way according to the laser power Pw (recording power) and Pe (erasing power). Therefore, it is also possible to configure the circuit in which the base current varies in a pulsating way according to the changeover between the laser power Pw and Pe.

Next, description will be given of a voltage control method of controlling the power source VSO of the laser driving section when the temperature detected by the temperature detector 121 changes from Ti to T2 in the embodiment of the optical disk apparatus having the laser characteristic shown in FIGS. 4 to 6 and the transistor characteristic shown in FIG. 7.

As already described by referring to FIG. 6, to maintain the desired laser power P1 when the temperature goes up from low temperature T1 to high temperature T2, it is required to lower the laser driving voltage by $\Delta V1$.

On the other hand, as described by referring to FIG. 4, to maintain the desired laser power P1 when the temperature varies from low temperature T1 to high temperature T2, the required laser driving current (collector current Ic) increases from I1 to I2. As can be seen from FIG. 7, when the collector current Ic becomes greater, the emitter-collector voltage Vce of the transistor 306 goes up from V1 to V2 by $\Delta V2$. That is, to maintain the desired laser power P1 at temperature change from Ti to T2, it is required to increase the emitter-collector voltage Vce by $\Delta V2$.

Although the value of Ib is fixed in the description of FIG. 1, if the recording waveform for the operation is as shown in FIG. 19, the value of $\Delta V2$ for Ib1 corresponding to the recording power Pw differs from that for Ib2 corresponding to the erasing power Pe. However, by appropriately adding such value of $\Delta V2$ to the emitter-collector voltage Vce, the value of Vce can be appropriately controlled for power of each multipulse recording waveform shown in FIG. 19.

As described above, when the temperature varies from T1 to T2, the voltage of the power source VSO of the laser driving section to implement the laser power P1 is attained as below. While $\Delta V1$ is subtracted from the voltage of the power source VSO in consideration of the characteristic with respect to temperature between the laser driving voltage and the laser power shown in FIG. 6, $\Delta V2$ is added thereto in consideration of the relationship between the collector current Ic and the emitter-collector voltage Vce shown in FIG. 7.

Figure 8:
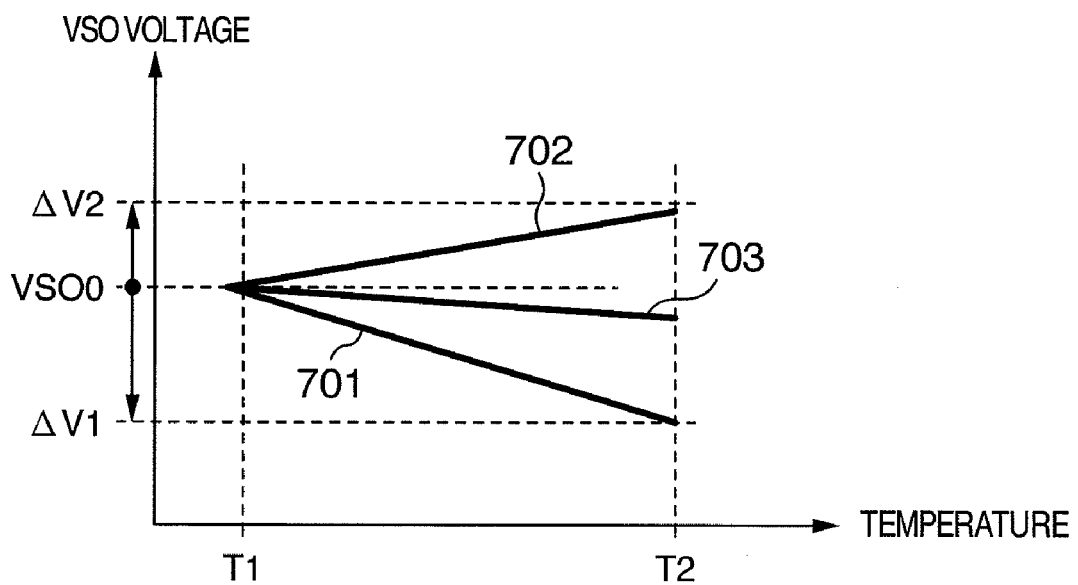
FIG. 8 is a graph showing a power source voltage control profile in the first embodiment.

By beforehand storing the values of $\Delta V1$ and $\Delta V2$ at temperature change from T1 to T2 in, for example, a memory of the microcomputer 118, it is possible to obtain a power source voltage at a particular temperature value between T1 and T2 through linear interpolation using, for example, a solid line 703 shown in FIG. 8.

When the microcomputer 118 controls the voltage converter 123 such that the power source voltage at the particular temperature obtained as above is inputted to the power source VSO of the laser driver 117, it is possible that at temperature increase of the laser 103 and the laser driver 117, the increase in power consumption due to the increase in the headroom voltage associated with the lowering in the laser driving voltage is suppressed while securing an appropriate laser driving current. This resultantly reduces the calorific value of the laser driver 117 which is one of the factors of deterioration of the laser emission characteristics.

According to the first embodiment of the optical disk apparatus described above, the temperature of the laser or the laser driver is acquired to control the power source voltage of the laser driver to thereby lower the power consumed by the headroom of the laser driver to a minimum level without deteriorating the laser emission characteristic. As a result, it is possible to suppress the increase in the laser driver temperature which occurs as below. At decrease in the laser driving voltage when the laser temperature becomes higher for example, in a successive recording operation; the headroom voltage goes up and hence the power consumed by the headroom increases, and hence the laser driver temperature goes up. Therefore, it is possible to reduce the deterioration in the recording characteristic due to the temperature increase in the laser disposed in the vicinity of the laser driver.

In the embodiment, the VSO voltage shown in FIG. 8 depends on the Vce-Ic characteristic of the transistors used in the laser driver 117. The Vce-Ic characteristic depends on the current value of the control signal 204 as the pulse driving current described above. Therefore, using the peak current or a mean current value for the setting value of the control signal 204 as the pulse driving current, a peak value obtained from the laser driving current, a mean value obtained using a Low-Pass Filter (LPF), or the like; the control operation may also be carried out on the basis of the Vcc-Ic characteristic associated with the current value.

In the embodiment, the temperature detector 121 is disposed on the pickup by way of illustration. However, there may also be employed a configuration in which the temperature detector 121 is placed in the laser driver 117 and a configuration in which the temperature detector 121 is disposed on a chassis of the optical disk apparatus other than the pickup. As a result, it is also possible that the number of parts is reduced, the assembly efficiency is improved, and the production cost is lowered.

Figure 9:
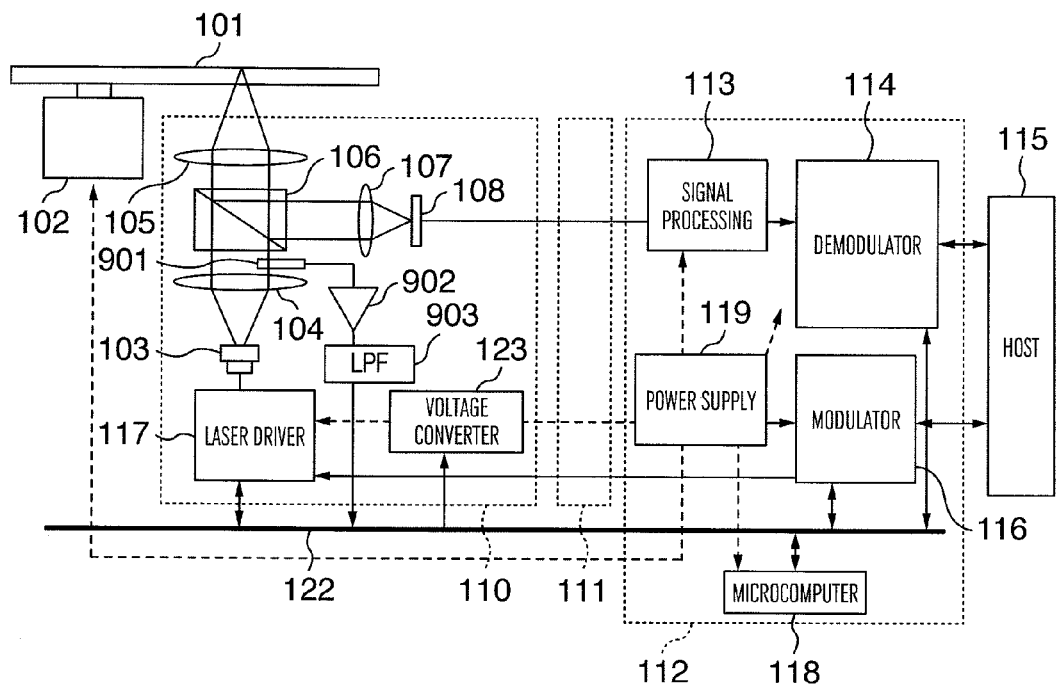
FIG. 9 is a block diagram showing a configuration of an optical disk apparatus in a second embodiment of the present invention.
Figure 10:
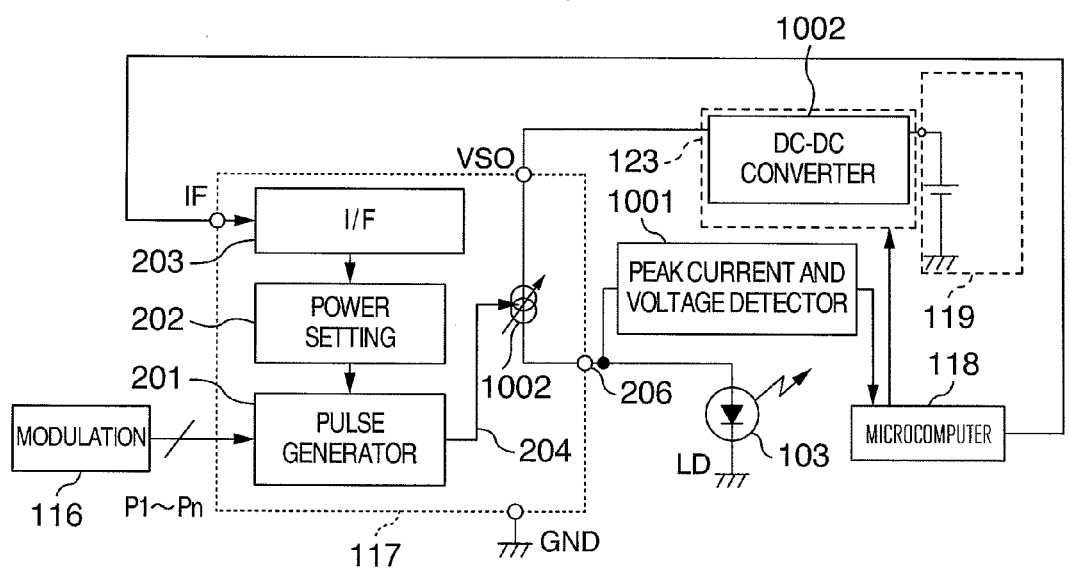
FIG. 10 is a block diagram showing an internal configuration of the laser driver and a peripheral circuit configuration in the second embodiment.

Next, a second embodiment will be described. FIG. 9 shows a configuration of an optical disk apparatus in the second embodiment. FIG. 10 shows a configuration of the laser driver 117 and its peripheral circuits in the second embodiment. In FIGS. 1 and 2, the common constituent components are assigned with the same reference numerals, and description thereof will be avoided.

FIG. 9 differs from FIG. 1 as below. In FIG. 9, while the temperature detector 121 is removed, a monitor diode 901, an amplifier 902, and a Low-frequency Path Filter (LPF) 903 are disposed for Auto Power Control (APC). FIG. 10 differs from FIG. 2 as below. In FIG. 10, while the temperature detector 121 is removed, a peak current/voltage detecting circuit or detector 1001 is arranged.

Next, description will be given of operation of the second embodiment. In the second embodiment, the signal flow of the recording and reproducing operations is similar to that of the first embodiment, and hence description thereof will be avoided. In the recording and reproducing operations, the monitor diode 901 detects power of an emitted laser beam to input the detected power via the amplifier 902 and the LPF 903 to the microcomputer 118. The microcomputer 118 controls the power setting section 202 of the laser driver 901 such that the detected power inputted thereto is used as a predetermined target value.

Figure 11:
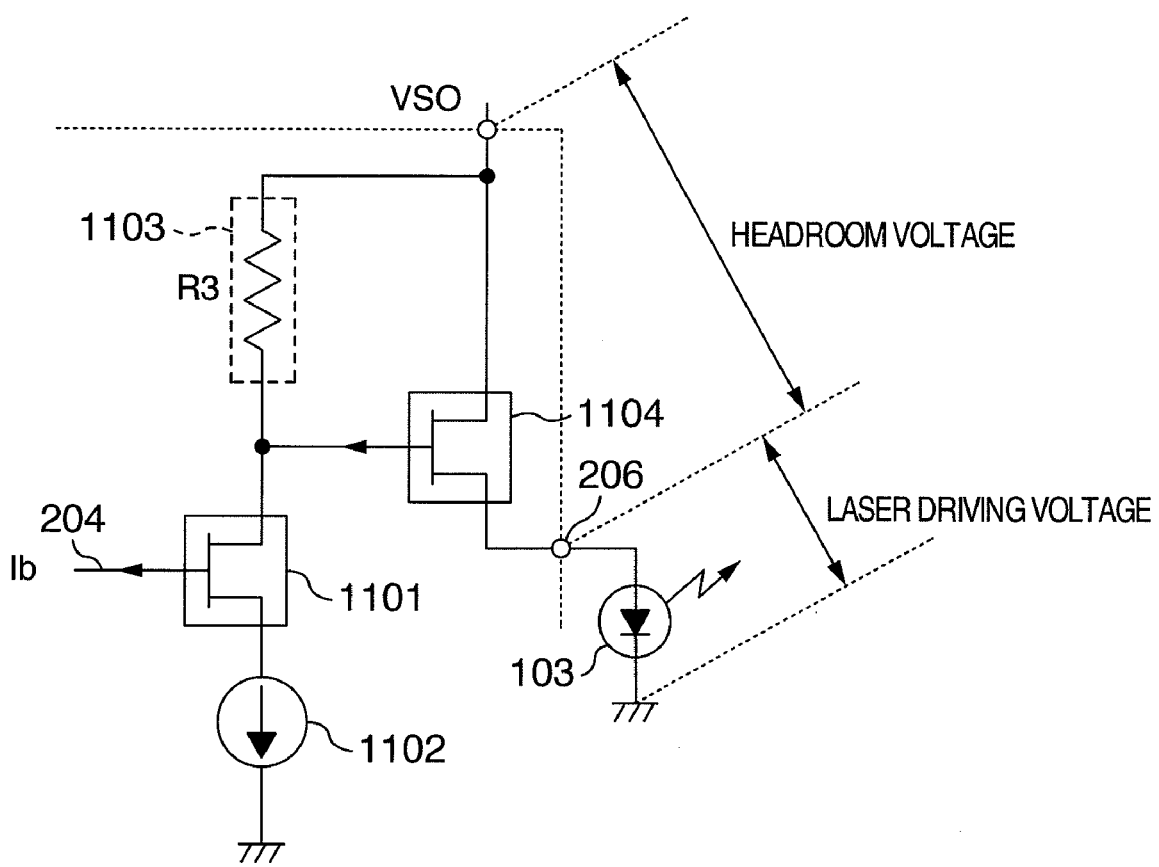
FIG. 11 is a diagram showing a configuration of a variable current source in the second embodiment.

FIG. 11 shows an example of a circuit configuration of a current source 1002. The control signal 204 (Ib) from the pulse generator is fed via an FET 1101 and a bias current generator 1102 to an amplifier including a resistor 1103 and an FET 1104 for amplification of a current thereof. The amplified current is outputted from the laser drive output terminal 206 to the laser 103. The headroom voltage generated in the circuit is the source-drain voltage Vds generated in the FET 1104.

Figure 12:
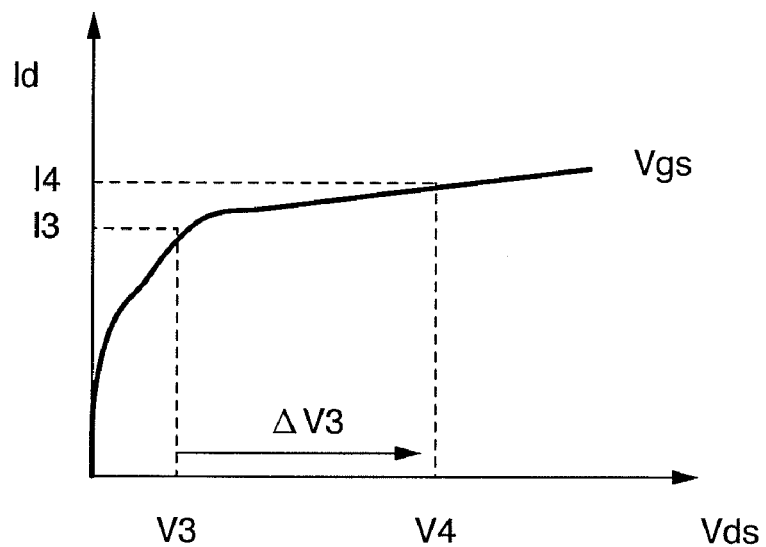
FIG. 12 is a graph showing an example of the Vds-Id characteristic of a Field-Effect Transistor (FET).

On the other hand, FIG. 12 shows an example of the characteristic between the source drain voltage Vds and the drain current Id of the FET 1104 shown in FIG. 11. The gate-source voltage Vgs as a parameter of the characteristic shown in FIG.

12 depends on the pulse driving voltage inputted as the control signal 204 in FIG. 10. The value of the control signal 204 is set to Vgs in this situation.

Figure 13:
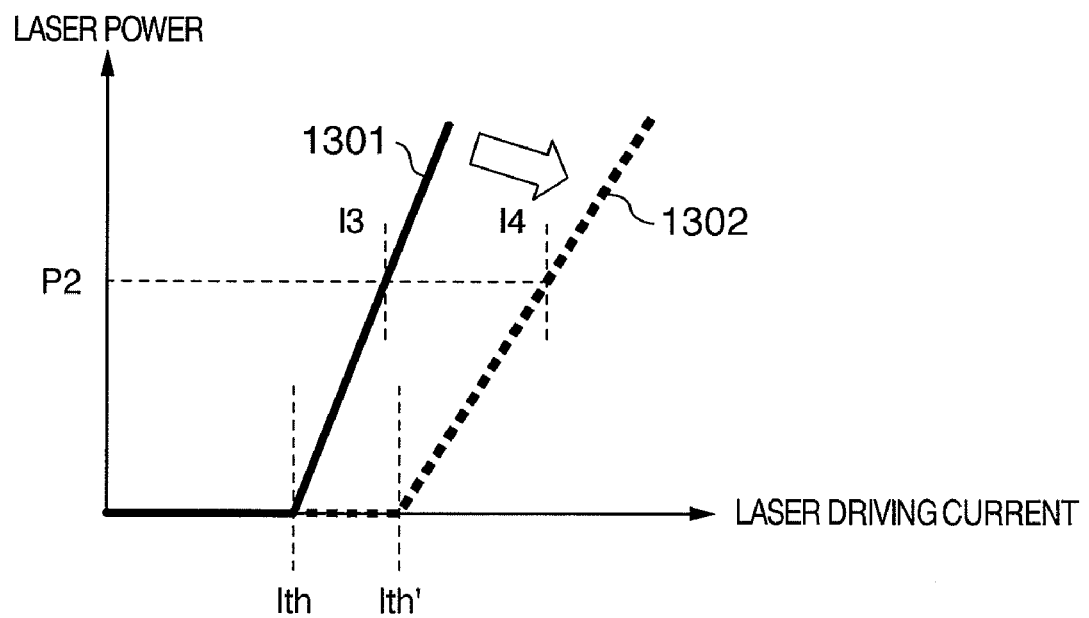
FIG. 13 is a graph showing an example of a change with respect to time of the relationship between the laser driving current and the laser power.

In general, the current characteristic of a laser diode, particularly, a blue laser diode deteriorates with the lapse of time as shown in FIG. 13. Therefore, for example, to secure desired emission power P2, it is required to increase the driving current value from 13 to 14 in association with the characteristic change from a solid line 1301 to a broken line 1302 due to the change with the lapse of time or aging. When the current compensation is conducted through the APC operation described above, the headroom voltage Vds increases from V3 to V4 by AV as shown in FIG. 12. The peak current/voltage value detecting circuit or detector 1001 of FIG. 10 detects a peak value of the laser driving current to input the peak value to the microcomputer. As a result, the microcomputer controls the DC-DC converter 1002 to thereby control the power source VSO of the laser driving section.

Figure 17:
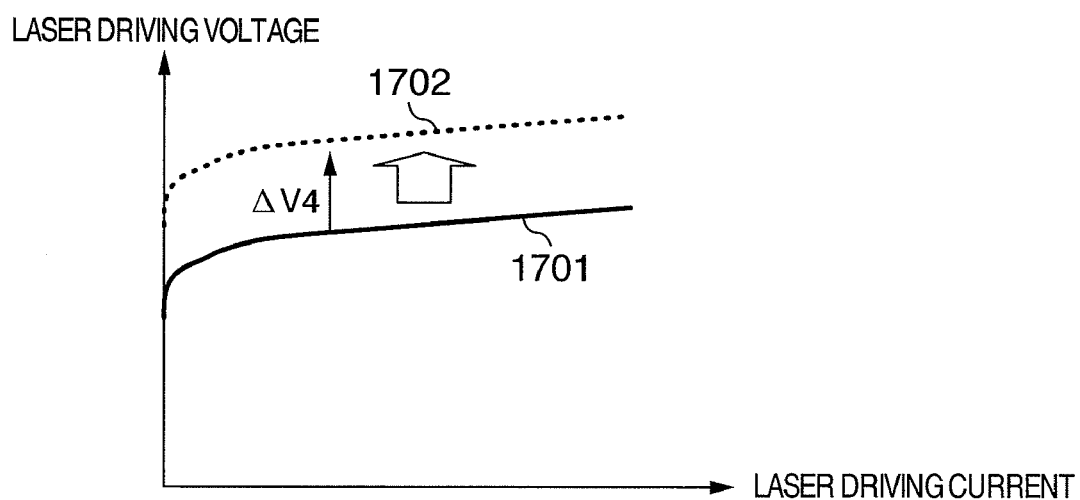
FIG. 17 is a graph showing an example of a change with respect to time of the relationship between the laser driving current and the laser driving voltage.

Also, the driving voltage characteristic changes from a solid line 1701 to a broken line 1702 due to the aging as shown in FIG. 17. Therefore, to maintain a desired laser driving current value, it is required to increase the laser driving voltage by $\Delta V4$ in association with the aging. In the embodiment of the optical disk apparatus, there is supplied the voltage of the power source VSO of the laser driving section, the voltage including the voltage change described above.

Figure 14:
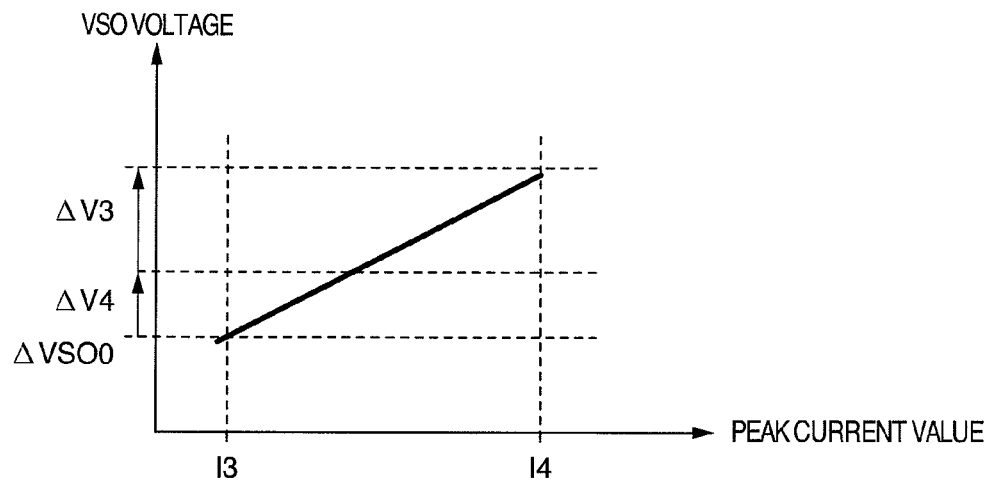
FIG. 14 is a graph showing a power source voltage control profile in the second embodiment.

FIG. 14 shows an example of the output voltage from the DC-DC converter 1002 for the monitored peak current value. As shown in FIG. 14, for the initial power source voltage VSO0 before the aging, the circuit compensates for the variation $\Delta V4$ relative to the reference value (the peak value depending on the initial characteristic) of the peak voltage output from the peak current/voltage detector 1001 and for the voltage variation $\Delta V3$ due to the voltage characteristic of the headroom in association with the current change from 13 to 14.

In the embodiment, the headroom characteristic employed in the control operation depends on Vgs of the FET 1104 and on the gate input voltage, i.e., the record control pulse supplied to the control signal 204 of FIG. 11 as described above.

Therefore, in almost the same way as for the first embodiment of the present invention, the control operation is conducted according to the Vds-Id characteristic (FIG. 4) on the basis of a peak value obtained from the laser driving current, a mean value thereof obtained using a Low-Pass Filter (LPF), or the like. As a result, in association with the variation in the laser driving current due to the aging, it is possible that the power consumed by the laser driver is reduced to the maximum extent without deteriorating the laser driving characteristic. This reduces the deterioration of the laser characteristic due to heat generated by the laser driver.

According to the second embodiment of the optical disk apparatus described above, also for the increase in the laser driving current and voltage due to the aging of the laser, by monitoring the driving voltage and current to control the power source voltage of the laser driver, it is possible to reduce the power consumed by the laser driver while securing the laser characteristic. By suppressing the laser temperature increase and by optimizing the laser driving current and voltage, it is possible to secure stable lifetime of the laser characteristic.

Figure 15:
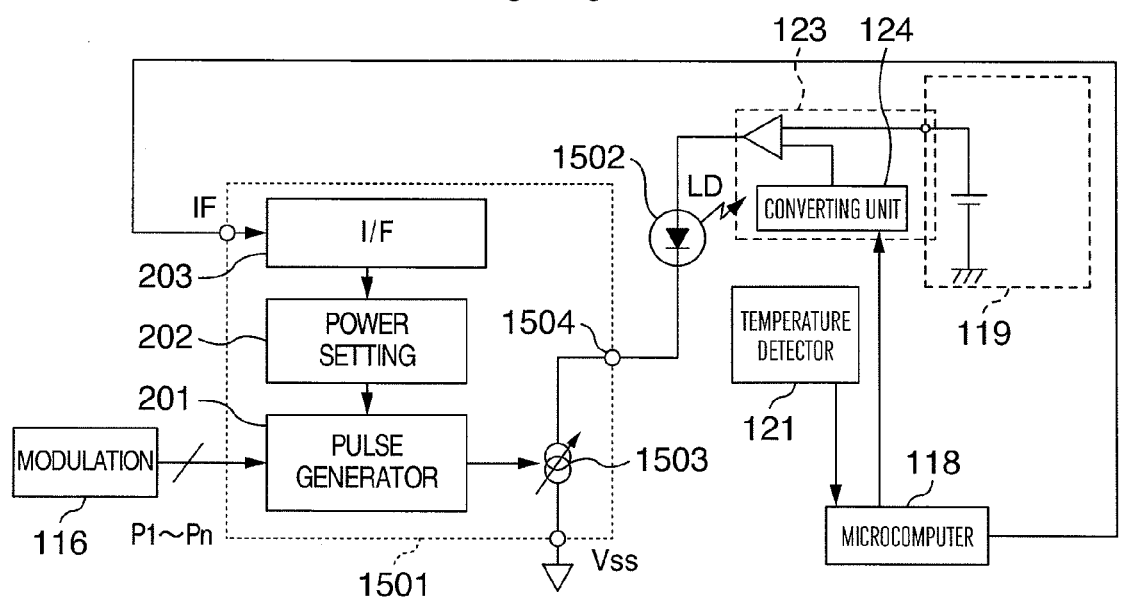
FIG. 15 is a block diagram showing an internal configuration of a laser driver and a peripheral circuit configuration including a Laser Diode (LD) of cathode drive type and having a function similar to that of the first embodiment.

In the embodiments, the laser cathode is grounded by way of illustration. However, in a case in which there is employed an element such as a blue diode which requires a high voltage equal to or more than seven volts, the circuit may be configured in a similar way as for the first embodiment also when there are employed a laser 1502 and a laser driver 1501 in which the cathode is current-driven. In FIG. 15, the blocks having almost the same functions as those of FIG. 2 are assigned with the same reference numerals, and description thereof will be avoided.

Figure 16:
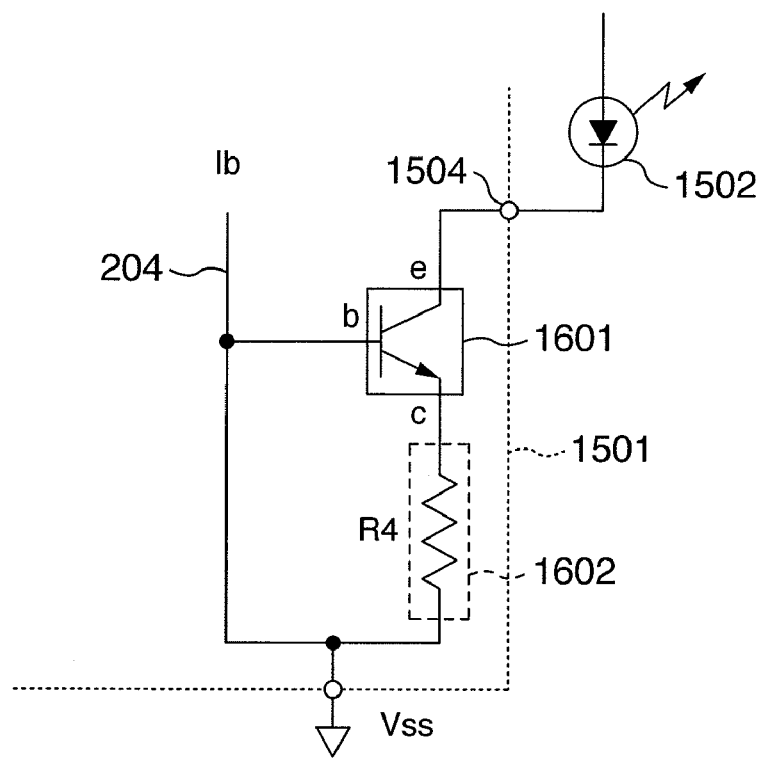
FIG. 16 is a diagram showing a configuration of a variable current source in FIG. 15.

FIG. 16 shows a circuit configuration of the variable current source 1503. Also in this case as in the first embodiment, according to the Vce-Ic characteristic of a transistor 1601, there is constructed a control profile of the voltage converter 123 as shown in FIG. 8. The voltage converter 123 is controlled according to the profile to thereby obtain an advantage similar to that of the first embodiment.

Figure 18:
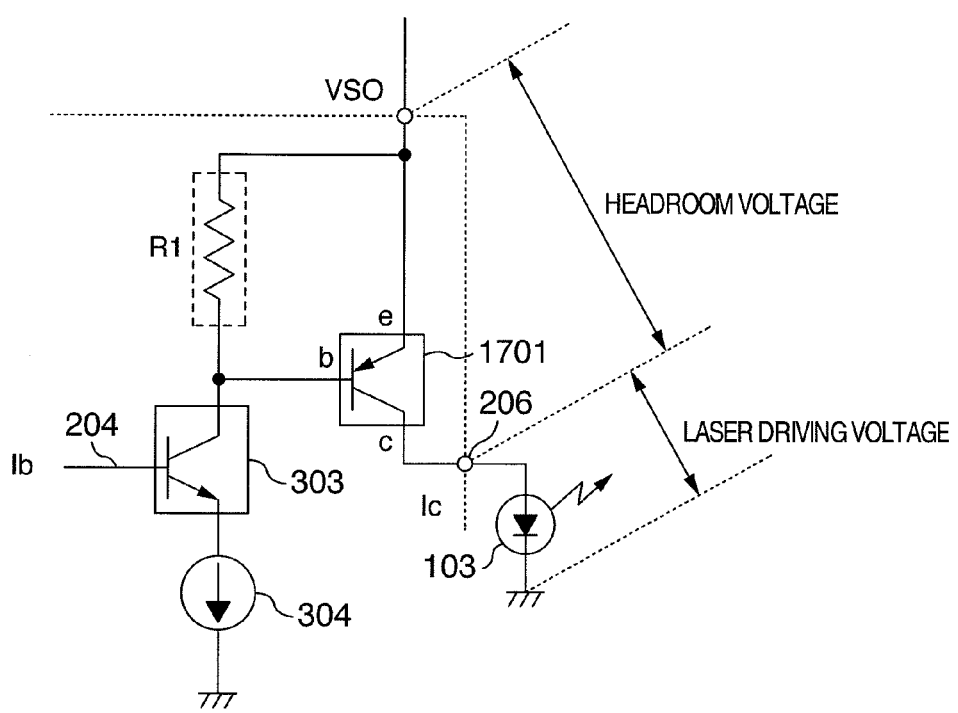
FIG. 18 is a diagram showing a configuration of another variable current source in an embodiment of the present invention.

The configuration of the variable current source to conduct record pulse control as shown in FIG. 18 is applicable also to either one of the embodiments.

In the examples of the first and second embodiments, a microcomputer is employed to control the power source voltage of the laser driver. However, the present invention is not restricted by the embodiments. There may also be considered a method in which, for example, a detected temperature value or a detected peak current value is inputted to a Digital Signal Processor (DSP) to control the power source voltage using a Read-Only Memory (ROM) table in the DSP and a method in which a detected temperature value or a detected peak current value is used as a voltage output or a current output to directly control the voltage converter.

According to the configurations of the first and second embodiments of the present invention, the laser driver on the pickup receives record pulse timing from the modulator on the main board. However, also when there is used a laser driver integrally including recording strategy in which, for example, a modulated signal such as a Non-Return-to-Zero-Inverted (NRZI) signal or the modulated signal and a recording clock signal is or are received from a modulator on the main board such that record pulse control is conducted on the laser driver, the configuration after the pulse generator of each of the embodiments is kept unchanged, and hence the present invention is applicable.

According to the present invention, it is possible that the temperature increase in the laser driver is mitigated to appropriately control the laser power. By mitigating the temperature increase in the laser driver and the pickup on which the laser driver is mounted, the laser life can be elongated. By appropriately controlling the laser power, recording quality of the optical disk can be improved. From the optical disk on which data is recorded according to the present invention, there can be reproduced signals with high quality.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical disc apparatus comprising:
   a laser for emitting a laser beam onto an optical disc;
   a laser driver for supplying power to the laser;
   a power source for supplying power to the laser driver;
   a laser emission power monitoring element for monitoring laser emission power of the laser, and for outputting data based on an amount of the laser emission power monitored;
   a detecting circuit for detecting the data outputted from the laser emission power monitoring element; and
   a microcomputer for receiving the data from the detecting circuit, and for the controlling power source so as to change an amount of voltage to be supplied to the laser driver in accordance with an amount of the laser emission power indicated by the data, wherein the change in the amount of voltage causes an amount of power consumption of the power source to be reduced, and wherein the power consumption is reduced to the maximum extent possible without deteriorating laser driving characteristic.

2. The optical disc apparatus according to claim 1, wherein the microcomputer is configured to increase an amount of voltage to be supplied to the laser driver if the amount of the laser emission power indicated by the data increases, and to decrease the amount of voltage to be supplied to the laser driver if the amount of the laser emission power indicated by the data decreases.

3. The optical disc apparatus according to claim 1, wherein the microcomputer is configured to decrease an amount of voltage to be supplied to the laser driver if the laser emission power indicated by the data increases, and to increase the amount of voltage to be supplied to the laser driver if the laser emission power indicated by the data decreases.

4. The optical disc apparatus according to claim 1, wherein the laser emission power monitoring element comprises a monitor diode.

5. An information recording method for use with an optical disc apparatus comprising the steps of:
   emitting a laser beam onto an optical disc at a laser;
   supplying power to a laser driver;
   monitoring a laser emission power of the laser;
   producing data indicative of an amount of the laser emission power of the laser;
   receiving the data by a microcomputer; and
   the microcomputer controlling a power source so as to change an amount of voltage supplied to the laser driver in accordance with the amount of the laser emission power indicated by the data, wherein the change in the amount of voltage causes an amount of power consumption of the power source to be reduced, and wherein the power consumption is reduced to the maximum extent possible without deteriorating laser driving characteristic.

6. The information recording method according to claim 5, further comprising the microcomputer increasing an amount of voltage to be supplied to the laser driver if the amount of the laser emission power indicated by the data increases, and decreasing the amount of voltage to be supplied to the laser driver if the amount of the laser emission power indicated by the data decreases.

7. The information recording method according to claim 5, further comprising the microcomputer decreasing an amount of voltage to be supplied to the laser driver if the amount of the laser emission power indicated by the data increase, and increasing the amount of voltage to be supplied to the laser driver if the amount of the laser emission power indicated by the data decreases.

* * * * *